(12) United States Patent
Huiberts et al.

(10) Patent No.: US 6,525,484 B1
(45) Date of Patent: Feb. 25, 2003

(54) ORGANIC ELECTROLUMINESCENT DEVICE

(75) Inventors: Johannes N. Huiberts, Eindhoven (NL); Loic C. A. Mourier, Eindhoven (NL); Peter Van De Weijer, Eindhoven (NL); Coen T. H. F. Liedenbaum, Eindhoven (NL); Martinus H. W. M. Van Delden, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/666,888

(22) Filed: Sep. 22, 2000

(30) Foreign Application Priority Data

Sep. 22, 1999 (EP) .......................................... 99203103

(51) Int. Cl.⁷ .............................................. G09G 3/10
(52) U.S. Cl. ...................... 315/169.3; 313/506
(58) Field of Search ................ 315/169.3, 169.1; 313/504, 506; 257/40, 103; 428/690, 917

(56) References Cited

U.S. PATENT DOCUMENTS

| | | | | |
|---|---|---|---|---|
| 4,895,734 A | * | 1/1990 | Yoshida et al. | 427/573 |
| 5,504,323 A | * | 4/1996 | Heeger et al. | 250/214.1 |
| 5,552,678 A | * | 9/1996 | Tang et al. | 315/169.3 |
| 5,828,181 A | * | 10/1998 | Okuda | 315/169.3 |
| 5,929,561 A | * | 7/1999 | Kawami et al. | 313/506 |
| 5,965,901 A | * | 10/1999 | Heeks et al. | 257/40 |

FOREIGN PATENT DOCUMENTS

| EP | 0704912 A1 | 4/1996 |
|---|---|---|
| EP | 0893939 A1 | 1/1999 |

\* cited by examiner

Primary Examiner—Don Wong
Assistant Examiner—Ephrem Alemu
(74) Attorney, Agent, or Firm—Aaron Waxler

(57) ABSTRACT

The invention provides a tool to select reliable organic LED devices, where the risk for failure before the end of its lifetime is low. This tool comprises the steps of:

i) subjecting the device to a high electric field over the electroluminescent layer. This leads to a division of the devices into two, clearly separated, populations, namely one population with a low leakage current (current through the electroluminescent layer in reverse voltage operation) and one population with a high leakage current. In this step, the first population is selected in accordance with a current criterion.

ii) detecting instabilities in the leakage current, referred to as noise. It has been established that these instabilities arise in particular at reverse driving voltages between 1 and 10 Volts. These instabilities are a measure of the occurrence of early failures during operation. In this step, the devices are selected in accordance with a noise criterion.

5 Claims, 5 Drawing Sheets

ORGANIC ELECTROLUMINESCENT DEVICE

BACKGROUND OF THE INVENTION

The invention relates to an electroluminescent device comprising at least one display element which comprises at least one electroluminescent layer of organic material, which is sandwiched between two conductor layers, which device is configured as a diode, which device generates light when said layer is subjected to an electric field.

The invention further relates to a method of manufacturing such an electroluminescent device.

SUMMARY OF THE INVENTION

An electroluminescent (EL) device is a device which, while making use of the phenomenon of electroluminescence, emits light when the device is suitably connected to a power supply. If the light emission originates in an organic material, said device is referred to as an organic electroluminescent device. An organic EL device can be used, inter alia, as a thin light source having a large luminous surface area, such as a backlight for a liquid crystal display or a watch. An organic EL device can also be used as a display if the EL device comprises a number of EL elements, which may or may not be independently addressable.

The use of organic layers as an EL layer in an EL element is known. A class of said known organic layers generally comprise a conjugated, luminescent compound. Said compound may be a low-molecular dye, such as a coumarin, or a high-molecular compound, such as a poly (phenylenevinylene). The EL element also comprises two electrodes, which are in contact with the organic layer. By applying a suitable voltage, the negative electrode, i.e. the cathode, will inject electrons and the positive electrode, i.e. the anode, will inject holes. The recombination of these electrons and holes may generate light. If the EL element is in the form of a stack of layers, at least one of the electrodes should be transparent to the light to be emitted. A known transparent electrode material for the anode is, for example, indium tin oxide (ITO). Known cathode materials are, inter alia, Al, Ba, Yb, Mg:Ag, Li:Al or Ca. Known anode materials are, in addition to ITO, for example, gold and platinum. If necessary, the EL element may comprise additional organic layers, for example, of an oxadiazole or a tertiary amine, which serve to improve the charge transport or the charge injection.

An EL device of the type mentioned in the opening paragraph is disclosed in EP-A-0 893 939, which describes an electroluminescent display device comprising an organic electroluminescent element formed on a substrate and an organic compound layer group sandwiched between cathodes and anodes. The organic compound layer group has laminated electroluminescent functional layers formed of at least one kind of organic compound. The organic electroluminescent display device further includes an airtight case that encloses the organic electroluminescent element with a space formed between the airtight case itself and the organic electroluminescent element and isolates the organic electroluminescent element from outside air.

As disclosed in EP-A-0 893 939, there may be a small risk of dust adhesion on the organic EL element. Since the organic EL functional layer has a very small thickness of a submicron order, a short circuit due to the dust is liable to occur between the transparent electrode (anode) and the back electrode (cathode). The conventional countermeasure for preventing short circuits are washing and smoothing of the surface of the substrate. However, as it is impossible to perfectly clean the substrate surface, there still remains possibility of occurrence of short circuits.

Also the influence of moisture, oxygen or the like, when permeated into the organic layer via a defect in, for example, the cathode layer, may cause deterioration of the organic electroluminescent functional layer.

In order to reduce the risk of a short circuit, EP-A-0 893 939 employs a filler gas filling the space within the airtight case. Said filler gas includes at least one kind of combustion-supporting gas. The combustion-supporting gas oxidizes the cathode material of a portion surrounding a short circuit to form an insulator, and thereby suppresses the occurrence of a short circuit. A combustion-supporting gas is a gas-oxidizing agent that does not burn itself, but helps combustion of other materials. Known combustion-supporting gasses are, e.g. oxygen, dinitrogen oxide, ozone, chlorine, nitrogen monoxide, fluorine, nitrogen trifluoride, oxygen difluoride, etc.

The necessary encapsultation of a filler gas implies strong restrictions on future architectures of organic electroluminescent devices.

The invention aims to provide a reliable organic electroluminescent device as described in the first paragraph where the risk for failure before the end of its lifetime, is strongly reduced.

To this end the organic electroluminescent device is characterized in that the leakage current is less than 10 $\mu$A per $cm^2$ electroluminescent surface area when said layer is subjected to a reverse bias in the range of 1–10 volts. Said leakage current of less than 10 $\mu$A per $cm^2$ electroluminescent surface area is the leakage current through the area of the electroluminescent layer which, in operation, may emits light. Preferably, the instabilities in the leakage current, referred to as noise, have a noise level less than 0.02, in particular less than 0.017. To obtain this measure for the noise, the measurements are normalized with $I_{norm}$ as will be explained below. It has been found that devices that meet this criterion have a low risk for failure before the end of their lifetime.

The invention is based on the recognition that not only a leakage current, but also an unstable leakage current may be a precursor for the occurrence of an early failure such as a short circuit. The leakage current is the current through the electroluminescent device, which is configured as a diode, when said diode is operated in reverse bias. In order to characterize the instabilities in the leakage current, a noise level is determined as follows:

a. A predetermined, reverse voltage (here 1 V) is set on the electroluminescent device, configured as a diode, during a predetermined time interval (here 10 seconds).

b. The leakage current of an electroluminescent device is sampled (here every 0.1 seconds, yielding 100 measurements).

c. The NOISE at the certain reverse voltage is calculated using the following equation:

$$\text{NOISE}=((|\Delta I(t=2.5 \text{ s})|+|\Delta I(t=2.6 \text{ s})|+ \ldots +|\Delta I(t=9.8 \text{ s})|)/74)/I_{norm}$$

Were $|\Delta I(t=2.5 \text{ s})|$ is positive value of the difference of the leakage current measured at time t=2.5 seconds and measured at time t=2.6 seconds after the reverse voltage is set. $I_{norm}$ is determined as follows:

$$I_{norm}=(I(t=2.5 \text{ s})+I(t=2.6 \text{ s})+ \ldots +I(t=9.9 \text{ s}))/75$$

The first 25 points of the measurement are discarded due to the effect of local heating on the resistance of the local leakage path leading to a change of the current.

d. The reverse voltage is switched off for 10 seconds.

e. Subsequently procedure steps a to d are repeated for reverse voltages 2, 3, 4, 5, 6, 7, 8, 7, 6, 5, 4, 3, 2, and 1 V on the electroluminescent device, configured as a diode. The NOISE is determined for every reverse voltage.

f. The maximum value of the NOISE measurements is the noise level of the device is less than 0.02.

The normalization procedure enables the comparison the noise levels of different devices despite differences in leakage current.

In the device in accordance with the invention the leakage current is preferably less than 0.5 $\mu$A per cm$^2$ electroluminescent surface area when said layer is subjected to 4 volts in reverse bias. The instabilities in the leakage current, referred to as noise, preferably have a noise level less than 0.006. Of said devices, less than 1% shows an early failure.

Measurements yielded a clear correlation between the height of the noise level and the occurrence of an early failure for a collection of samples. However for this measurement the processing of the devices was made optimal. Leakage currents are extremely low and the correlation found indicates that the leak path responsible for the unstable behavior is the same as the leak path which responsible for most of the leakage current. As the instabilities will be of the order of the leakage current of that particular leakage path the normalization procedure will yield reliable results. The noise levels of different devices can be compared despite differences in leakage current (the reason why the normalization procedure is used). However, in a realistic production situation, processing will never be optimal. The leakage current will be an order of magnitude higher and the contribution of the current flowing through the unstable leak path to the total leakage current is only a fraction of the total leakage current. Consequently, noise level measurements on devices made under less optimal processing conditions may be quite unreliable.

The leakage current is approximately proportional to the square of the reverse voltage. Other leakage currents, background leakage currents which do not originate from the electroluminescent layer, show an approximately linear dependency between the leakage current and the reverse voltage. In conclusion, the leakage current can be distinguished from the other leakage currents by studying the non-linear component of the leakage current when the device is subjected to a reverse bias in the range from 1–10 volts. In particular, when the determination of a reliable NOISE-value is hindered by large background leakage currents, it is preferred to normalize with V$^2$ in stead of I$_{norm}$. Here V$^2$ is the square of the reverse voltage during the measurement. In the device according to the invention it is preferred that the instabilities in the leakage current have a noise level of less than 8.33 nA/V$^2$. The normalization with V$^2$ yields a number, referred to as NOISE(V), which is proportional to the NOISE as defined above. It was found that a NOISE of 0.020 corresponds approximately with a NOISE(V) of 8.33 nA/V$^2$, and a NOISE of 0.006 corresponds approximately with a NOISE(V) of 2.50 nA/V$^2$. The NOISE(V) is particularly useful for electroluminescent devices having a large background current, such as matrix displays.

Surprisingly, a pre-conditioning procedure applied to the devices made under less optimal processing conditions shows a remarkable effect on the leakage currents and on the instabilities in the leakage current.

To this end a method of manufacturing an electroluminescent device is characterized in that the device is subjected to a reverse field of at least 100 V per micrometer electroluminescent layer thickness.

When the reverse electric field is established a leakage current starts to flow. For some devices the leakage current is very high or will increase in time, and such devices must be rejected as being unreliable. Other devices will show a decrease of this leakage current in time, which suggests a kind of repairing mechanism. Local pathways for the leakage current seem to be made inactive or to be destroyed. The device is subjected to the reverse electric field until the leakage current is reduced to less than 10% of the leakage current at the beginning of the pre-conditioning procedure.

The exact voltage used to establish the reverse electric field used in the procedure is not too important, or to put it differently, there is quite a broad range of voltages were the procedure behaves in a similar way. This is important as the thickness variations of the electroluminescent layer for different devices allowed for by the presently used manufacturing process are reasonably large (10%). The electric field is equal to the applied voltage divided by the thickness.

If the reverse electric field over the organic layer is too high this will lead to damage. In other words, the reverse electric field must not result in an electrical breakdown of the layer of organic material. On the other hand when a too reverse electric field is applied, the pre-conditioning procedure will not work. When using a relatively low reverse electric field strength of 100 V/$\mu$m, said pre-conditioning procedure may be repeated to obtain the desired effect.

Preferably, the reverse electric field is at least 170 volts per micrometer electroluminescent layer thickness. A pre-conditioning procedure using these high reverse electric fields yielded less rejected devices after the first pre-conditioning cycle, suggesting a means of increasing the yield of the production process.

Preferably, a method of manufacturing an electroluminescent device of the invention is characterized in that the device is subjected to a reverse voltage in the range from 10 to 15 volts. As the light emitting layer of the device is typically 100 nm thick, the reverse electric field is in the range of approximately 100–150 volts per micrometer electroluminescent layer thickness. Because, the leakage current predominantly originates from local pathways, the electric voltage over these local pathways is predominantly the driving force for this pre-conditioning procedure. The electric field over the electroluminescent layer influences the pre-conditioning procedure to a lesser extend.

The method according to the invention may also be advantageous for organic electronics in general and organic diodes, also non-light-emitting, in particular. Said organic electronic devices may also suffer from leakage currents and/or leakage current instabilities, with the risk of a short circuit. The reliability of said organic electronic devices may also be increased by using the pre-conditioning process and/or the noise level measurements.

These and other aspects of the invention are apparent from and will be elucidated with reference to the embodiments described hereinafter.

DESCRIPTION OF THE PREFERRED EMBODIMENTS

A Polymer Light Emitting Diode (PLED) is essentially a near perfect insulator typically 100 nm thick, which is sandwiched between two conductors (the electrodes). For the devices described here, these layers are completely shielded from air. The device structure is similar to, and behaves like, a capacitor. Furthermore it has all the characteristics of a diode due to the work-function difference of the surrounding electrodes (close to 2 eV). In forward bias, the current will flow through the insulating material upon injection from the electrodes. This current is partly transformed into light, which is emitted from the device, as one of the electrodes used is a transparent conductor. One of the main reasons for the occurrence of an early failure in a current-driven PLED device is the appearance of a parallel leak path through the thin insulator (the electroluminescent layer). This leak path carries either i) the total driving current or ii) a large proportion of the driving current at driving voltages respectively just below or just above the built-in voltage of the device respectively. Failure in the first sense is registered by the user as a sudden drop of the light intensity down to zero while in the second sense a diminishing of the light intensity is registered where in many cases the light intensity shows an unstable (flickering) behavior. Both cases should be avoided.

The leakage paths can be studied by looking at the behavior of the leakage current. This can be measured by operating the device in reverse bias (4 Volt is used for all the results shown in this document). However, a clear correlation between the size of the leakage current and the occurrence of early failures could not be established. Great efforts have been made in solving the problem by improving the process of making these devices, especially with respect to cleaning procedures. It proved to be impossible to rule out the occurrence of early failures mainly due to the small thickness of the electroluminescent layer compared to the size of different types of particles present during the manufacturing. As this small thickness is necessary for a low voltage operation of the PLED as required by specifications of most customers, a selection criterion is necessary to be able to distinguish between good devices (no early failure before the end of the lifetime of the device) and bad devices (early failure before the end of the lifetime).

Figure 1:
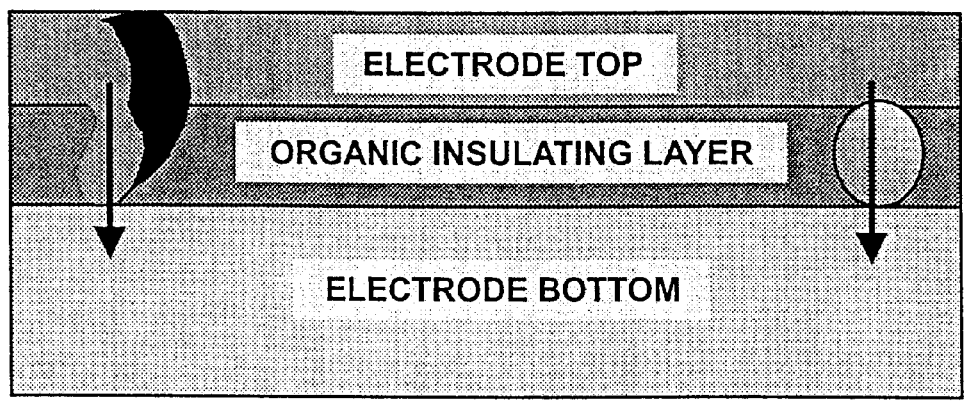
FIG. 1 is a schematic representation of a Polymer LED device. Two possible current leak paths are depicted on the left (damage) and on the right (conducting particle).
Figure 2:
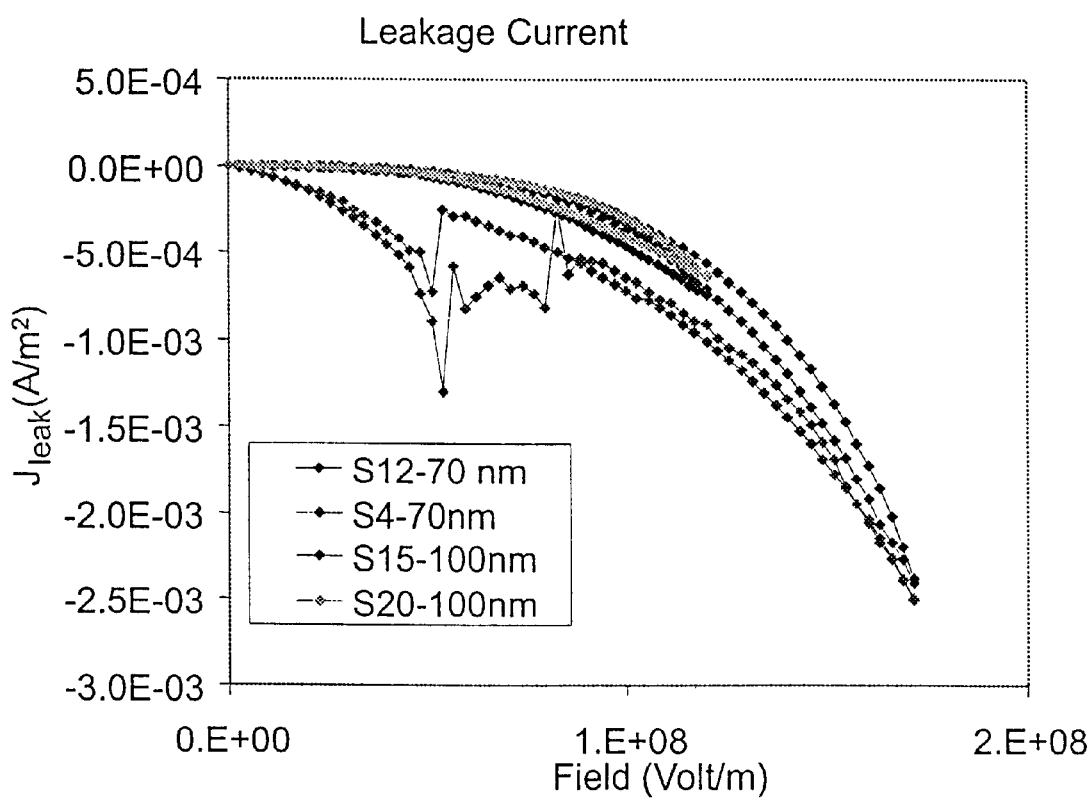
FIG. 2 presents the results of a leakage current measurement for four devices showing large instabilities f6r one of them (S4). The inset shows the different thickness of the electroluminescent layer for that specific device.

There are clear indications that an unstable leakage current (in reverse voltage) is a precursor for the occurrence of an early failure in the sense as described above. After failure, the size of the instabilities in the leakage current are of the order of the absolute value of the leakage current and they occur at voltages below 10 volt reverse bias (FIG. 2). The region of contact can be localized as a region of damage (typically 1 $\mu$m in diameter) surrounding a defect (FIG. 1) and visible under a microscope. The instabilities are caused by transient short circuits at the outer fringes of this region of damage. The moment the short circuit is established, the charge stored in the capacitor can flow through the short circuit. The large amount of power dissipated in the relatively small contact leads to the destruction of the short circuit and part of the surrounding material, leading to a bigger defect. This has been seen optically. The moment the instabilities arise, small sparks are visible along the edges of a short circuit, leading to an increase of the circumference of the region of damage. This process can be compared to a spark erosion process. At higher fields, the high electrostatic force leads to a stabilization of the contact. Although high leakage currents are allowed to flow, the contact is big enough to carry them without excessive local heating. It should be noted that the instabilities found in our polymer LED devices are very similar to the instabilities found in Organic LED devices and the criteria described here can also be used for the case of OLED devices.

Figure 3:
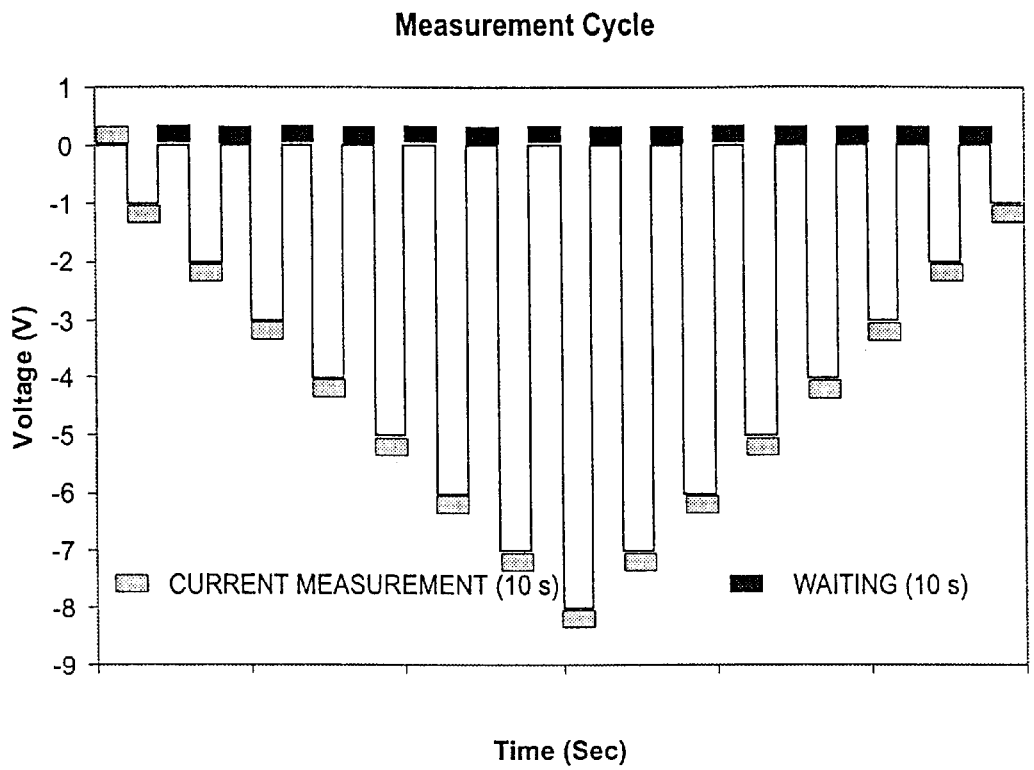
FIG. 3 presents an example of a measurement cycle for a noise measurement. The voltage is changed about every 10 seconds. During the measurement of the current, measurement points are taken at time intervals of 0.1 s.

Upon closer examination, it was found that these instabilities also exist on a smaller scale and a correlation could be shown between the size of these instabilities and the occurrence of early failure in the lifetime test. Due to the more or less random nature of these instabilities, they can be measured for a range of time intervals as long as the interval exceeds the RC-time of the device at hand. The measurement (example in FIG. 3) has to be carried out for a number of reverse voltages in the range where these instabilities are strongest (<10 V). In this example, a time interval between current measurements of 0.1 seconds was used.

Figure 4:
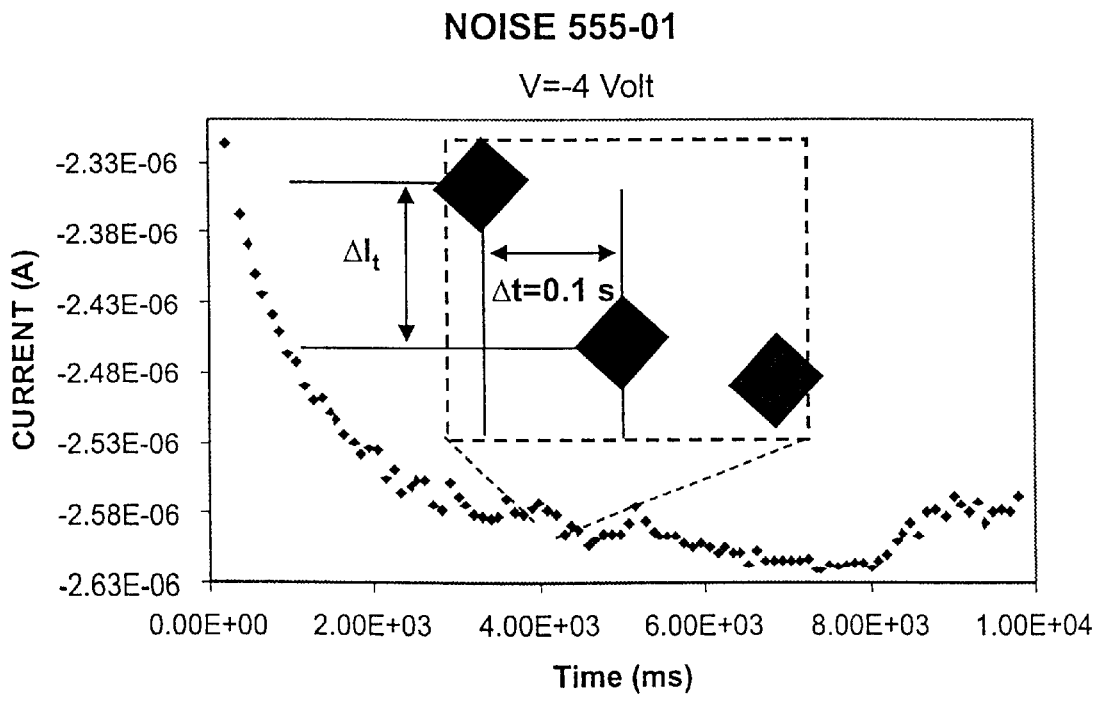
FIG. 4 presents an example of a current measurement at one voltage (−4 Volt).
Figure 5:
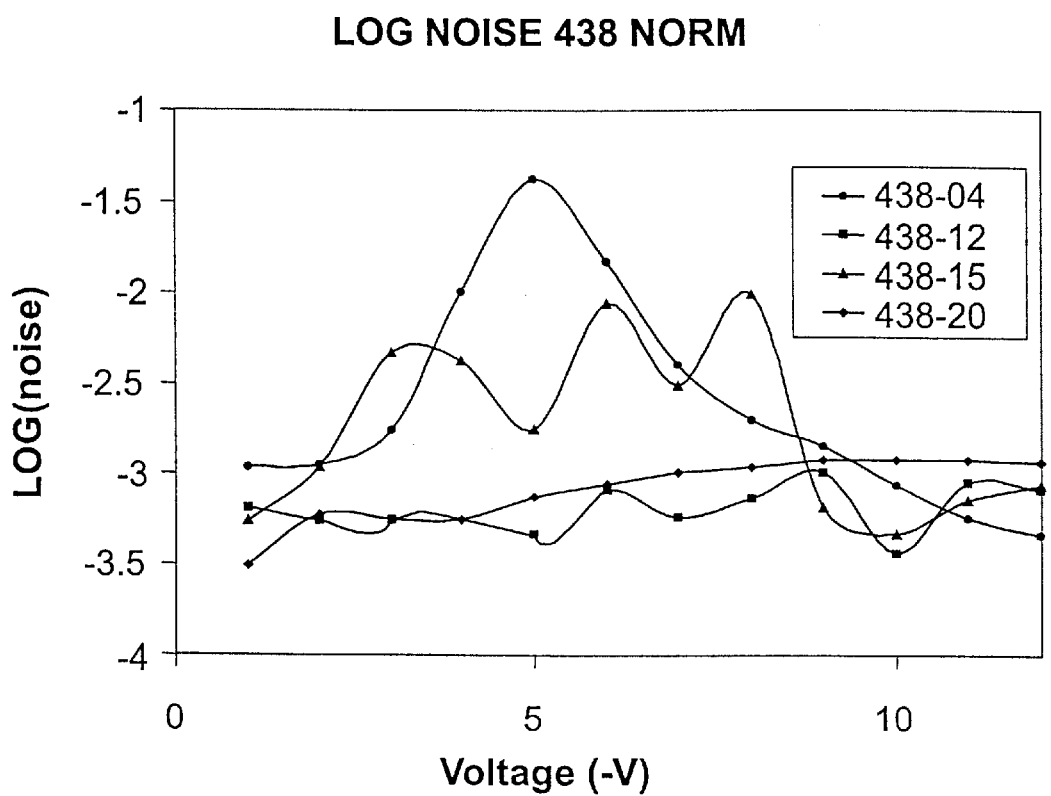
FIG. 5 presents an example of a noise measurement for the same devices used for the I-V measurements in FIG. 2. Notice the broad high noise level for the sample with the unstable leakage current (Sample-04). On the other hand the noise level of Sample 15 is also high although the measured I-V curve didn't show any apparent indication of unstable behavior (FIG. 2). The noise level is low below 2 volt and again above 9 volt. Upon prolonged operation Sample 15 and Sample 04 showed a failure.

An example of a current measurement at one field (voltage) is depicted in FIG. 4. For one field, the noise is defined above. The reason why measurements take place at several fields is the stabilizing effect which a prolonged measurement at one field has on the noise level. The device is more or less "teased" by changing the field after a certain period of time. The region between 0 and −8 volts (in the example of FIG. 4) is covered so as to be certain that the maximum noise level for this specific device is found (FIG. 5). This maximum noise level is used in the criterion (FIG. 6).

Figure 6:
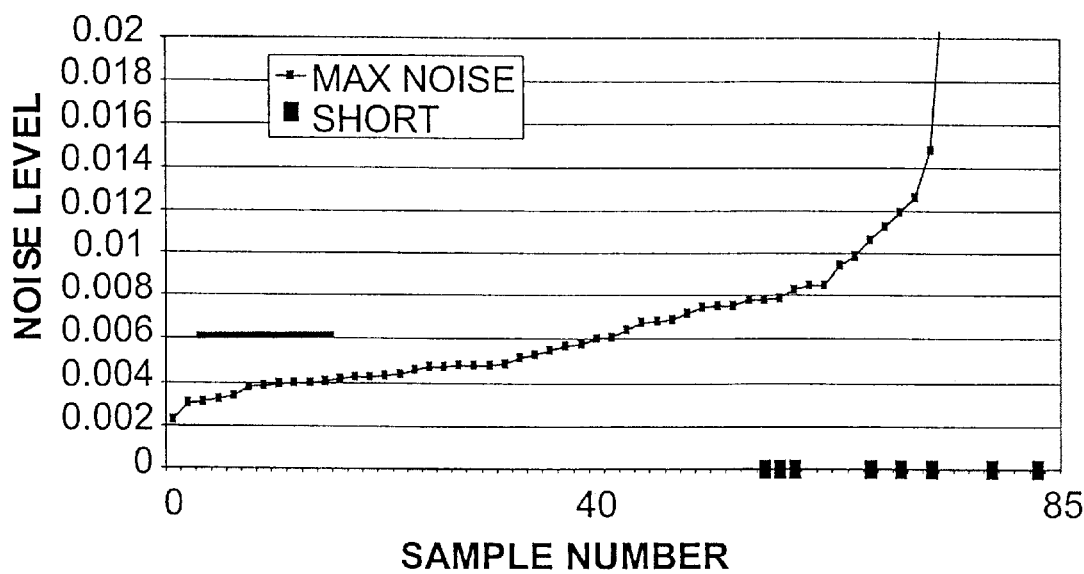
FIG. 6 presents a correlation of the maximum noise level found at one of the fields in a measurement described in FIGS. 3 and 4. For different devices this maximum can be found at different fields. The samples which show a short circuit before the end of lifetime of the device in an accelerated lifetime measurement (T=363 K and at 50% humidity the lifetime is 250 hours) are tagged by a square on the X-axis. The fat line indicates the level used at present in the criterion.

The measurement shown in FIG. 6 shows a clear correlation between the height of the noise level and the occurrence of an early failure for a collection of 85 samples. However, for this measurement, the processing of the devices was made optimal. Leakage currents are extremely low and the correlation found indicates that the leak path responsible for the unstable behavior is the same as the leak path responsible for most of the leakage current. As the instabilities are of the order of the leakage current of that particular leakage path, the normalization procedure will yield reliable results. The noise levels of different devices can be compared despite differences in leakage current (the reason why the normalization procedure is used). However, in a realistic production situation, processing will never be optimal. The leakage current will be an order of magnitude higher and the contribution of the current flowing through the unstable leak path to the total leakage current is only a fraction of the total leakage current. Measurements on devices made under less optimal processing conditions did not show the correlation found in FIG. 6. To be able to use the noise criterion, a pre-conditioning procedure has to be applied.

Figure 7:
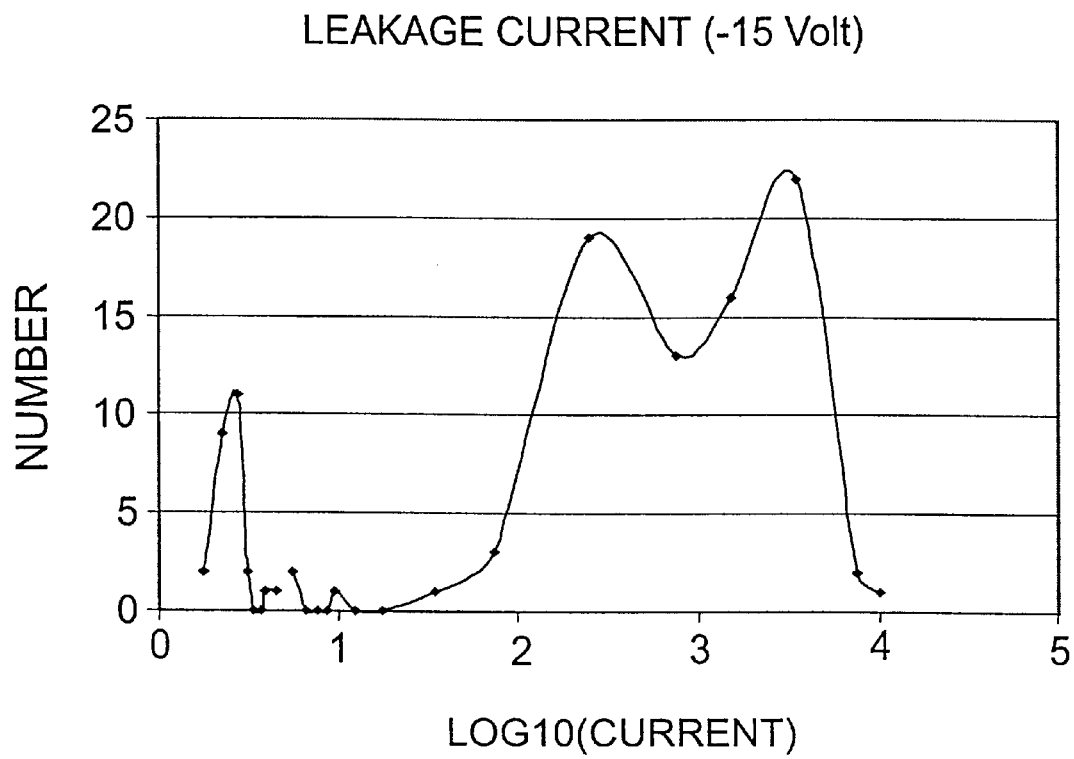
FIG. 7 presents the number of samples with a leakage current in an interval around the point in the graph, when using 4 volts in reverse bias. The interval ranges from a leakage current halfway the previous point to a leakage current halfway to the next point. Two distinctly different populations arise after the pre-conditioning procedure at −15 Volt. Note the logarithmic scale of the X-axis. The first population has a leakage current between 2 and 2.5 $\mu$A while the second population has a leakage current between 500 $\mu$A and 5 mA. Before the preconditioning procedure these populations are not distinguishable (See also FIG. 8).
Figure 8:
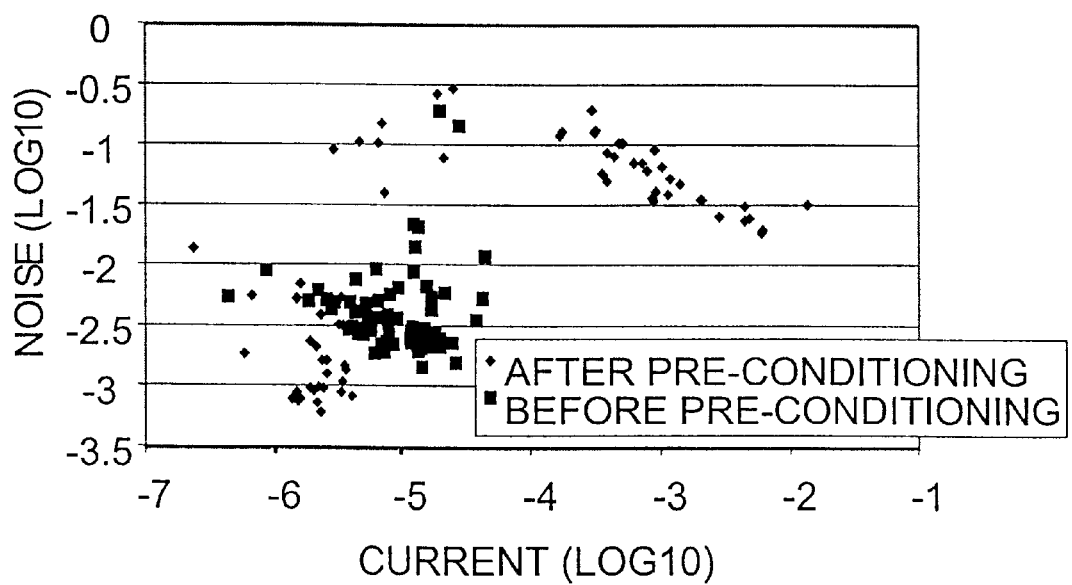
FIG. 8 presents samples before and after the pre-conditioning procedure. The vertical axis gives the noise level of the devices while the leakage current for a reverse voltage of 4 volt, is used as the horizontal axis. Before pre-conditioning, all the devices are found in one group of points while after preconditioning, the two distinct populations are

Our devices are pre-conditioned by subjecting them to a high reverse voltage for a certain period of time. This has a remarkable effect on the distribution of leakage currents in a population of PLED devices. For a broad range of pre-conditioning voltages, two clearly distinguishable groups are obtained after the pre-conditioning procedure (FIG. 7, FIG. 8). The exact voltage used in the procedure is not too important, or to put it differently, there is quite a broad range of voltages were the procedure behaves in a similar way. This is important, as the thickness variations of the electroluminescent layer for different devices allowed for by the presently used manufacturing process are reasonably large (10%). The electric field is equal to the applied voltage divided by the thickness. If the electric field over the organic layer is too high, this will lead to damage. On the other hand, when a too low voltage is applied, the two distinct populations do not appear after the pre-conditioning procedure. A voltage region with a width of 5 volt was found, where a high reverse voltage can be applied without damaging the devices.

FIG. 8 shows you a graph in which noise and leakage current are measured before and after the pre-conditioning procedure. Apart from the fact that the two different populations appear, it is also remarkable that the samples with a high leakage current also show a high noise level, despite the normalization procedure. The normalization procedure should lead to a suppression of the noise level at these high leakage currents, but apparently the instabilities for these samples is so high that the noise level remains substantially higher than the noise level for "good" devices. In general we can say that subjecting the devices to a high field has three possible effects:

Firstly, a number of samples are healed. Leak paths disappear and the leakage current decreases. We force the devices into a situation where the noise criterion applies or where the unstable leak path is also responsible for the leakage current.

Secondly, the leakage paths of a number of devices are damaged, which leads to even higher leakage currents.

Thirdly, at too high fields, temporary stabilization can occur. These devices can be recognized as follows. After the first application of a high field, they behave like healed samples (low leakage current). When a high field is applied again for some time, it will be bound that the leakage current has increased to high values when it is measured afterwards. This occurs only at too high fields.

Figure 9:
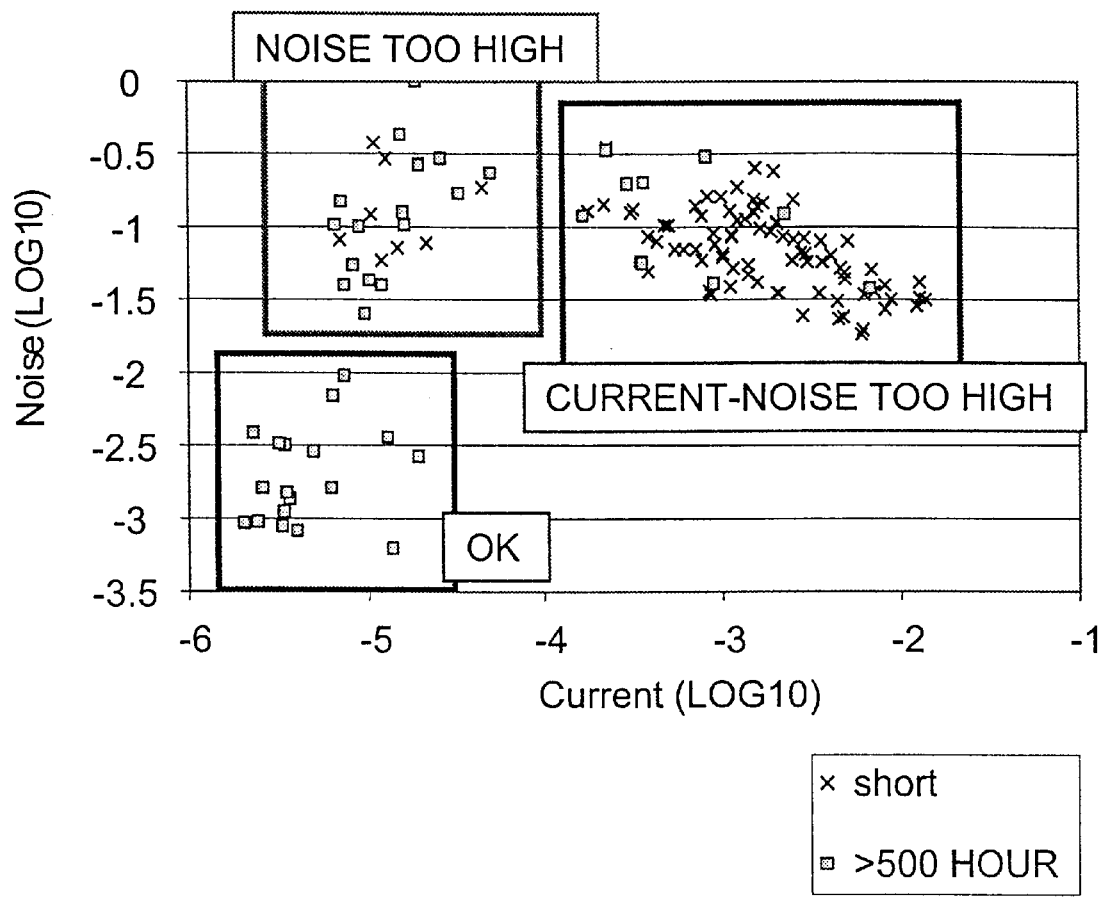
FIG. 9 depicts a chart showing three populations of leakage currents.

The currently used selection criterion rejects all devices which have a leakage current at −4 volt higher than 5 $\mu$A after the pre-conditioning procedure. A noise measurement is performed on the remaining population, rejecting all devices with a noise level more than 0.006. The result is shown in FIG. 9 for a population of 230 devices. The processing conditions were deliberately set at a level where a large amount of short circuits was expected before the end of lifetime. This is mainly achieved by performing a far from optimal filtration of the polymer solution before the application of the polymer layer by a spin coating process.

From FIG. 9 shows that there are actually three populations:

A population with a high leakage current and a high noise level (upper right square). The high leakage current makes these devices unsuitable for use. More than 90% of these devices showed an early failure during the lifetime experiment.

A population with a low leakage current but a high noise level (upper left square). About 30 to 40% of these devices showed an early failure during the lifetime measurement.

A population with a low leakage current and a low noise level lower left square). All devices remained intact during the lifetime measurement.

A firmer statistical basis was achieved by measuring a larger population of devices tested in lifetime under the same conditions, except for the fact that we use a 10 mA driving current. Also from this population, the good devices could be selected. No early failures were detected for this group during the lifetime test, while about 20 to 30% of the devices in the reference group showed an early failure. The early failures in the group of (rejected) devices could be localized and attributed to defects (particles) in the layer.

The criterion described above reduces the failure level from nearly 30% down to a value of less than 1%, even in the case where processing conditions are far from optimal.

In summary, the invention provides a tool to select reliable organic LED devices, where the risk for failure before the end of its lifetime is low. This tool comprises the steps of:

i) subjecting the device to a high electric field over the electroluminescent layer. This leads to a division of the devices into two, clearly separated, populations, namely one population with a low leakage current (current through the electroluminescent layer in reverse voltage operation) and one population with a high leakage current. In this step, the first population is selected in accordance with a current criterion.

ii) detecting instabilities in the leakage current, referred to as noise. It has been established that these instabilities arise in particular at reverse driving voltages between 1 and 10 Volts. These instabilities are a measure of the occurrence of early failures during operation. In this step, the devices are selected in accordance with a noise criterion.

What is claimed is:

1. A method of selecting between electroluminescent devices comprising at least one display element which comprises at least one electroluminescent layer of organic material, which is sandwiched between two conductor layers, which device is configured as a diode, which device generates light when said layer is subjected to an electric field, the method comprising subjecting the devices to a reverse electric field of at least 100 volts per micrometer electroluminescent layer thickness, detecting instabilities in the leakage current, and selecting between devices based on a noise criterion.

2. The method of claim 1, characterized in that the devices are subjected to a reverse electric field is at least 170 volts per micrometer electroluminescent layer thickness.

3. The method of claim 1, characterized in that the device is subjected to a reverse voltage in the range from 10 to 15 volts.

4. The method of claim 1, wherein the population having a low leakage current after this treatment is selected in accordance to a current criterion wherein the leakage current is less that 10 $\mu A/cm^2$.

5. The method of claim 1 and in which the population having a low leakage current after this treatment is selected in accordance to a current instability, referred to as noise, criterion.

* * * * *